(12) United States Patent
Kurita et al.

(10) Patent No.: US 6,437,251 B1
(45) Date of Patent: Aug. 20, 2002

(54) FLEXIBLE BOARD MADE BY JOINING TWO PIECES THROUGH AN ADHESIVE FILM

(75) Inventors: Hideyuki Kurita, Tokyo; Masanao Watanabe, Tochigi; Toshihiro Shinohara, Tochigi; Yukio Anzai, Tochigi; Mitsuhiro Fukuda, Tochigi, all of (JP)

(73) Assignee: Sony Chemicals Corp., Tokyo (JP)

(*) Notice: Subject to any disclaimer, the term of this patent is extended or adjusted under 35 U.S.C. 154(b) by 0 days.

(21) Appl. No.: 09/505,871

(22) Filed: Feb. 17, 2000

(51) Int. Cl.[7] ............... H05K 1/00; H05K 1/02
(52) U.S. Cl. .......... 174/254; 174/260; 174/259; 361/771
(58) Field of Search .............. 174/259, 250, 174/254, 260, 261, 262; 361/743, 760, 771, 768

(56) References Cited

U.S. PATENT DOCUMENTS 5,714,252 A * 2/1998 Hogerton et al. ......... 428/344
6,147,870 A * 11/2000 Pommer ..................... 361/746
6,246,014 B1 * 6/2001 Pommer ..................... 174/261

FOREIGN PATENT DOCUMENTS

JP B2-2865241 12/1998
JP 01-102734 * 4/2001

* cited by examiner

Primary Examiner—Kamand Cuneo
(74) Attorney, Agent, or Firm—Oliff & Berridge PLC

(57) ABSTRACT

This invention provides a specially-shaped, double-face flexible printed wiring board having a small pitch at a high production yield. Metal wirings 22 and 32 formed on a base film 21, 31 of two elemental pieces 20 and 30 of a flexible printed wiring board are arranged in such a manner as to face each other while sandwiching a bonding film 16 not containing conductive particles between them, and are heat-pressed to each other. The adhesive resin film 16 so softened is pushed aside from the metal wirings 22 and 32 and the low melting point metal coating films 23 and 33 formed on the surface of the metal wirings 22 and 32 come into direct contact with each other and are fused. In this instance, the softened adhesive resin film 16 is charged between the metal wirings 22 and 32. Therefore, the molten low melting point metal does not scatter. The base films 21 and 31 are bonded by the adhesive resin film 16.

4 Claims, 3 Drawing Sheets

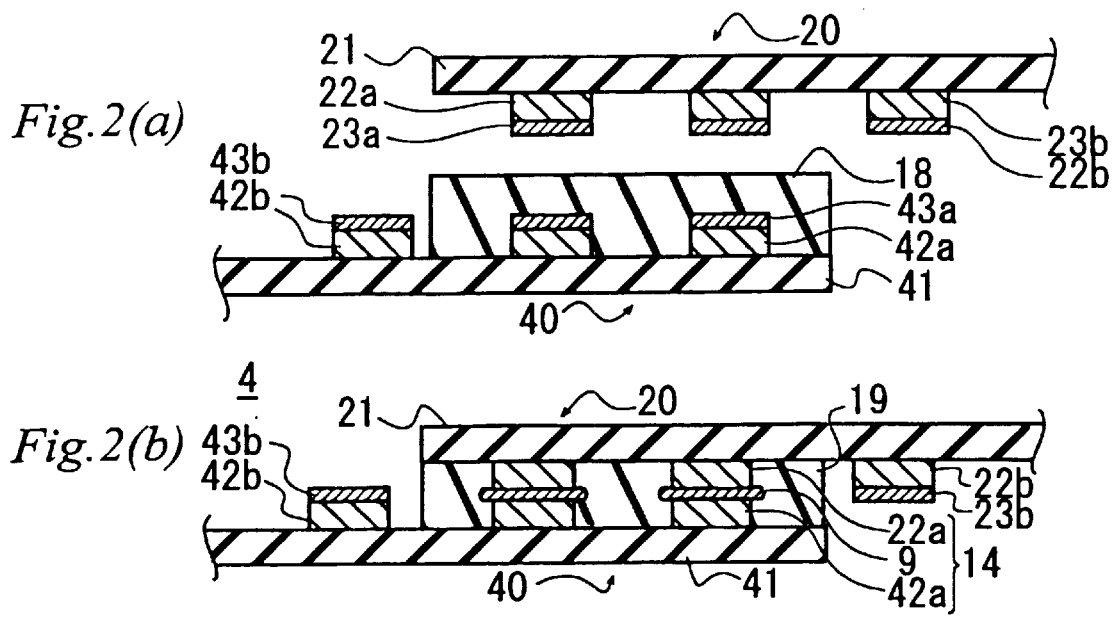

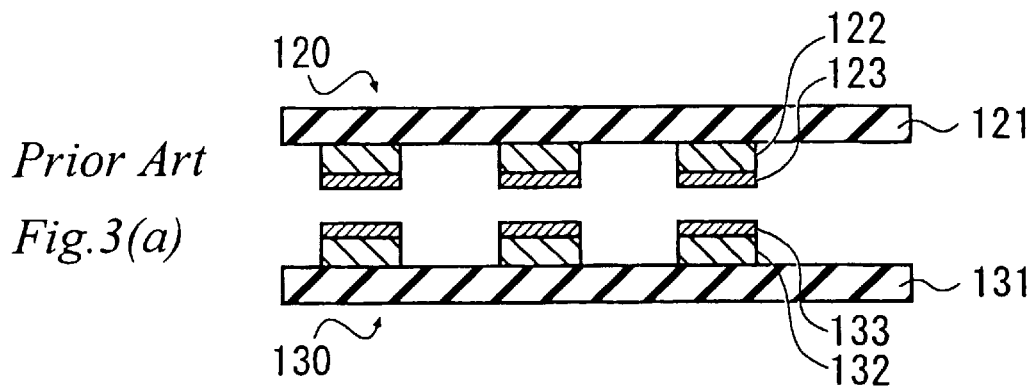
*Prior Art*
*Fig.3(a)*
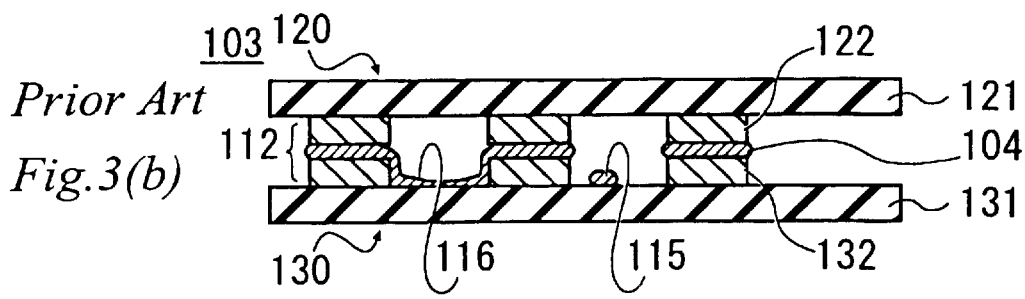
*Prior Art*
*Fig.3(b)*
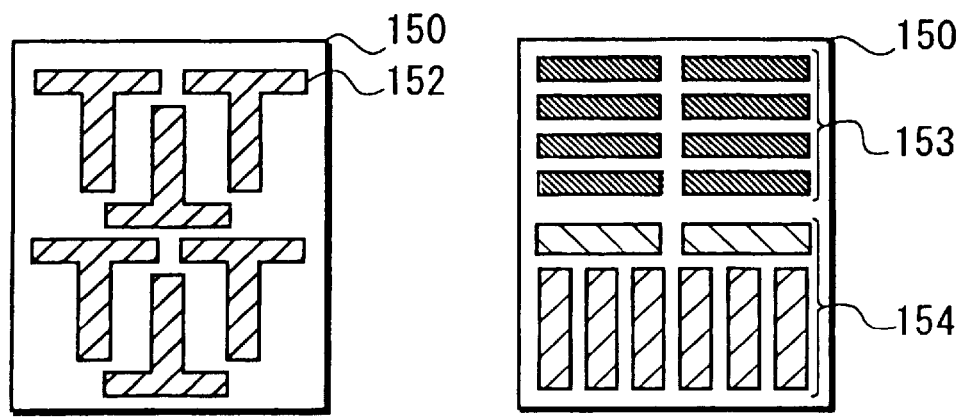
*Prior Art*
*Fig.4(a)*
*Prior Art*
*Fig.4(b)*
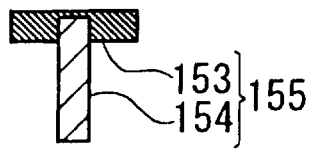
*Prior Art*
*Fig.4(c)*

FLEXIBLE BOARD MADE BY JOINING TWO PIECES THROUGH AN ADHESIVE FILM

FIELD OF THE INVENTION

This invention relates to a technological field of a flexible printed wiring board, more particularly to a technology of producing a double-face flexible printed wiring board having a complicated shape.

DESCRIPTION OF THE RELATED ART

Flexible printed wiring boards each having a desired circuit pattern printed thereon have gained a wide application in the past and flexible printed wiring boards having various shapes corresponding to the shapes of various position at which the substrates are used have been required in recent years.

FIG. 4(a) shows an arrangement when T-shaped flexible printed wiring boards 152 are cut out from a rectangular master sheet 150. In this drawing, six flexible printed wiring boards 152 can be acquired.

However, when the flexible printed wiring boards 152 having special shapes are cut out, a large area of the master sheet 150 is discarded in vain.

In the conventional art, therefore, attempts have been made to take a flexible printed wiring board in a complicated shape apart into elemental pieces in simple shapes and then bond these pieces together to give a flexible printed wiring board.

FIG. 4(c) shows an example where a flexible printed wiring board 155 having the same shape as that of the flexible printed wiring board 152 described above is formed by bonding two kinds of elemental pieces 153 and 154 together.

When the elemental pieces 153 and 154 having simple shapes are cut out from the master sheet 150 as shown in FIG. 4(b), the master sheet 150 can be utilized effectively. In in the case of FIG. 4(b), eight elemental pieces 153 and 154 can be acquired respectively. In this case, eight T-shaped flexible printed wiring boards 155 can be acquired by bonding the elemental pieces 153 and 154 to each other. Consequently, a greater number of T-shaped flexible printed wiring boards can be acquired than the case when the T-shaped flexible printed wiring boards 152 are directly cut out.

To bond plural elemental pieces to each other to thereby form a flexible printed wiring board, it is necessary to connect these elemental pieces mechanically and electrically to each other.

Reference numerals 120 and 130 in FIG. 3(a) show the elemental pieces which include metal wirings 122 and 132 comprising patterned copper thin films are formed on each of the polyimide films 121 and 131. To bond the elemental pieces to one another, the elemental pieces 120 and 130 are first arranged in such a manner that the metal wirings 122 and 132 face one another.

Solder coating films 123 and 133 are deposited by plating to each of the metal wirings 122 and 132. The solder coating films 123 and 133 are brought into close contact with each other, are then pressed while being heated to melt the solder coating films 123 and 133 and are then cooled, providing a solder layer 104. The solder layer 104 so formed gives a bond portion 112 at which the metal wirings 122 and 132 are firmly connected to each other.

Because these two elemental pieces 120 and 130 are firmly fixed through the bond portion 112, one flexible printed wiring board 103 can be acquired (FIG. 3(b)).

However, the pitch of the metal wirings 122 and 132 has become smaller and smaller because a large number of metal wirings on a flexible printed wiring board is required in recent years.

When the solder coating films 123 and 133 are molten while being pressed, the solder is likely to scatter because of the pressure. The scattering solder may exist sporadically inside the flexible printed wiring board 103 and in the extreme case, the outflow of the molten solder forms a bridge 116 between adjacent bond portions 112 and invites short-circuit of the adjacent portions 112. As the pitch of the metal wirings 122 and 132 becomes smaller, the bridge 116 is more likely to develop. In consequence, the production yield of the flexible printed wiring board 103 using the elemental pieces 120 and 130 drops.

SUMMARY OF THE INVENTION

The present invention has been completed in order to solve the problems of the prior art described above, and is directed to provide a technology of producing specially-shaped double-face flexible printed wiring boards with a small pitch of metal wirings and a high production yield.

To accomplish the object described above, the present invention relates to a method of producing a flexible printed wiring board by laminating a plurality of elemental pieces each including a resin film, a metal wiring formed on said resin film and a low melting point metal coating film formed in at least a part of regions on the metal wiring, which method comprises the steps of arranging an adhesive resin that exhibits an adhesiveness upon heating between the metal wiring of one of the elemental pieces and the metal wiring of another elemental piece; pressing one elemental piece to another elemental piece while they are being heated; connecting the metal wiring of one elemental piece to the metal wiring of another elemental piece via the low melting point metal coating film that is so molten; and bonding one elemental piece and another elemental piece via the adhesive resin.

The present invention relates to a method of producing a flexible printed wiring board, wherein the adhesive resin is film-like.

The present invention relates to a method of producing a flexible printed wiring board wherein the low melting point metal coating film is formed on the surface of both of the metal wirings that are to be connected mutually.

The present invention relates to a method of producing a flexible printed wiring board, wherein either one or both of the surface of the metal wiring and the surface of the low melting point metal coating film are exposed on one of the surfaces of the flexible printed wiring board.

The present invention relates to a method of producing a flexible printed wiring board, wherein either one or both of the surface of the metal wiring and the surface of the low melting point metal coating film are exposed on both of the surfaces of the flexible printed wiring board.

The present invention relates to a flexible printed wiring board that comprises at least two elemental pieces each having a resin film, a metal wiring formed on said resin film and a low melting point metal coating film formed in at least a part of regions on the metal wiring, wherein the elemental pieces are bonded to one another via said adhesive resin, and the metal wirings of the elemental pieces are connected to one another via said low melting point metal coating film.

BRIEF DESCRIPTION OF THE DRAWINGS

FIGS. 2(a) and 2(b) are sectional views each being useful for explaining step-wise another embodiment of the present invention;

FIGS. 3(a) and 3(b) are sectional views each being useful for explaining step-wise a method of producing a flexible printed wiring board according to the prior art; and FIGS. 4(a), 4(b) and 4(c) are schematic views each being useful for explaining a cutting method of a flexible printed wiring board.

DESCRIPTION OF THE PREFERRED EMBODIMENTS

The present invention has the construction described above, and provides a method of producing a flexible printed wiring board by bonding a plurality of elemental pieces to one another.

Each elemental piece of the flexible printed wiring board includes a base film made of a non-thermoplastic resin, and a metal wiring formed on the base film, and a low melting point metal coating film is formed on the surface of at least a part of the metal wiring.

At least two elemental pieces are arranged so that the metal wirings of elemental pieces face each other while sandwiching an adhesive resin between them. When the elemental pieces are pressed to one another while being heated, the metal wirings push into the adhesive resin, so that the metal wirings come into mutual contact.

In this case, the low melting point metal coating film is formed on one or both of the surfaces of the metal wirings that are brought into mutual contact. Consequently, the metal wirings are bonded to one another via the low melting point metal coating film.

When the low melting point metal coating film is molten and then cooled, the metal wirings are electrically connected to one another via the low melting point metal layer thus solidified.

On the other hand, when the adhesive resin is heated, it exhibits the adhesiveness. Then when it is cooled, the elemental pieces are bonded to one another via the adhesive resin.

Because a flexible printed wiring board can be produced by bonding a plurality of elemental pieces to one another in the manner described above, a flexible printed wiring board having a complicated shape can be acquired by combining elemental pieces having a simple shape. Therefore, a flexible printed wiring board can be produced at a low cost.

The adhesive resin described above may be applied in advance to the elemental pieces, or an adhesive resin formed into a film shape may be laminated on. Conductive particles need not be contained in the adhesive resin that is used in the present invention.

When two elemental pieces are bonded to each other, a part of the metal wiring is exposed. In this way, the surfaces of the metal wiring or the surfaces of the metal coating film can be exposed to both surfaces of the flexible printed wiring board. The exposed portion can be used for the connection with external circuits.

Now, the present invention will be described by reference to the attached drawings.

Figure 1A:
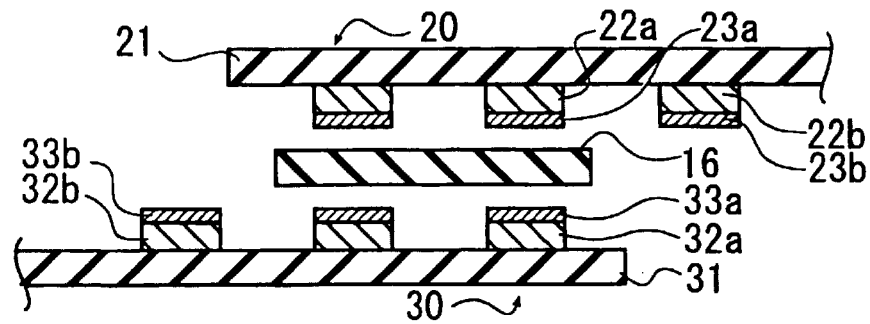
FIGS. 1(a)–1(c) are sectional views each being useful for explaining step-wise an example of a method of producing a flexible printed wiring board according to the present invention.
Figure 1B:
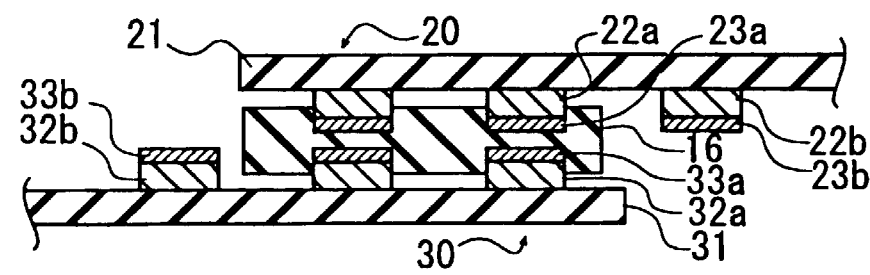
Figure 1C:
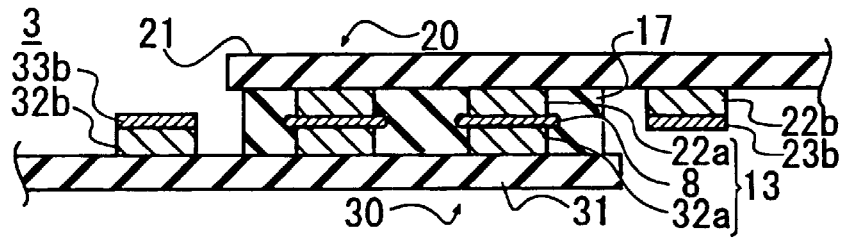

FIGS. 1(a)–1(c) show an example of production process steps of a flexible printed wiring board according to the present invention.

Referring to FIGS. 1(a)–1(c), two elemental pieces 20 and 30 are first prepared.

Each of the elemental pieces 20, 30 includes a base film 21, 31 made of a non-thermoplastic resin such as a polyimide film and a metal wiring 22 (22a, 22b), 32 (32a, 32b) formed on the surface thereof.

A low melting point metal coating film 23, 33 made of solder is formed by solder plating on the surface of each metal wiring 22, 32. Of each metal wiring 22, 32, a portion which is to be used for bonding is called an "inner bonding region 22a, 32a" and a portion which is to be exposed on the surface is called an "external connection region 22b, 32b", as will be explained later. Then, low melting point metal coating films are formed on the surfaces of the internal bonding regions 22a, 32a and the external connection regions 22b 32b, respectively, as represented by reference numerals 23a, 33a and 23b, 33b.

The inner bonding regions 22a and 32a of the two elemental pieces 20 and 30 are so arranged as to face each other while sandwiching an adhesive resin film 16 made of a thermoplastic resin that exhibits an adhesiveness upon being heated between them.

FIG. 1(a) shows this condition as described above. The adhesive resin film 16 comprises, for example, a thermoplastic polyimide synthesized from an aliphatic diamine and an acid anhydride, and this polyimide is formed into a film. Conductive particles need not be dispersed inside the adhesive resin film 16. In other words, the adhesive resin film 16 in the present invention is not an anisotropic conductive film.

The thickness of the adhesive resin film 16 varies depending on the thickness of the internal bonding regions 22a, 23a and on the thickness of the low melting point metal coating film 23a, 33a formed on the surface of the former. An adhesive resin film 16 having a thickness of 10 to 80 μm is typically used for the total thickness of 10 to 40 μm of the metal wiring 22, 32 and the low melting point metal coating film 23a, 33a.

When the low melting point metal coating films 23a and 33a on the internal bonding regions 22a and 32a are pushed into the adhesive resin film 16 while sandwiching the adhesive resin film 16, the adhesive resin film 16 between them is pushed aside (FIG. 1(b)).

When the adhesive resin film 16 has a softening point of 140 to 170° C., for example, a heat-pressing operation is conducted at 170° C. (at a pressure of 30 kg/cm$^2$ for 10 seconds) Then, the adhesive resin film 16 existing between the low melting point metal coating films 23a and 33a is completely pushed aside, and the low melting point metal coating films 23a and 33a are brought into contact with each other.

Next, while being pressed at a pressure of 30 kg/cm$^2$, heating is made to about 200 to 300° C. Then, the low melting point metal coating films 23a and 33a are molten, and are solidified upon cooling, giving a low melting point metal layer 8. The low melting point metal layer 8 and the internal bonding regions 22a and 32a connected by this low melting point metal layer 8 together form a bonding portion 13 that connects the metal wirings 22 and 32 both electrically and mechanically to each other (FIG. 1(c)).

When the low melting point metal coating films 23a and 33a are molten, a space between the resulting bonding portions 13 is filled with the softened adhesive resin film 16. In consequence, the melt of the low melting point metal coating films 23a and 33a does not scatter to form a bridge even when it spill from the connection regions 22a and 32a.

The base films 21 and 31 are exposed between the connection regions 22a and 32a, and the softened adhesive resin film 16 keeps contact with these base films 21 and 31. When the adhesive resin film 16 is hardened and the adhesive resin layer 17 is formed, the base films 21 and 31 are bonded to one another.

As the two elemental pieces 20 and 30 are bonded by the bonding portion 13 and the resin layer 17 in the manner described above, one flexible printed wiring board 3 is formed.

The two elemental pieces 20 and 30 can be formed into a specially-shaped flexible printed wiring board, for example, like a T shaped one in the same way as to bond the elemental pieces 153, 154 shown in FIG. 4(c).

The two elemental pieces 20 and 30 of this flexible printed wiring board 3 are bonded together in such a manner that the other elemental piece 30 (or 20) does not exist on one of the external connection regions 22b (or 32b). Therefore, the low melting point metal coating films 23b and 33b formed on the connection regions 22b and 32b of the elemental pieces 20 and 30 are exposed on the surface of the connection regions 22b and 32b.

In other words, terminals of external circuits or semiconductor devices can be connected to the external connection regions 22b and 32b. It is also possible to expose the metal wirings 22 and 32 directly on the external connection regions 22b and 32b without forming the low melting point metal coating films 23b and 33b.

Figure 1D:
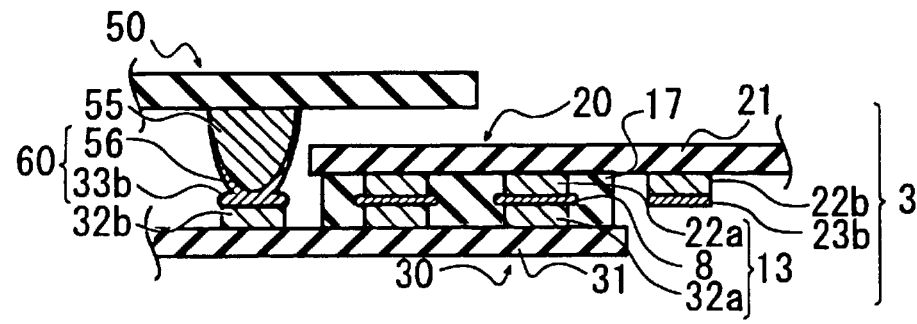
FIG. 1(d) is a sectional view being useful for explaining a semiconductor device connected to the flexible printed wiring board according to the present invention.

FIG. 1(d) shows a semiconductor device 50 connected to the flexible printed wiring board 3. The semiconductor device 50 has a conductive bump 55 having a low melting point metal coating film 56 formed on the surface of the conductive bump 55.

When the low melting point metal coating film 56 formed on the surface of the conductive bump 55 is brought into contact with the low melting point metal coating film 33b on the external connection region 32b of the flexible printed wiring board 3 and then heated, the low melting point metal coating film 33b and 56 become one.

Referring to FIG. 1(d), reference numeral 60 shows a low melting point metal layer 60 consisted of the low melting point metal coating film 33b and 56.

The conductive bump 55 of the semiconductor device 50 is connected to the external connection region 32b of the flexible printed wiring board 3 via a low melting point metal layer 60.

When a part of the metal wiring is exposed while two elemental pieces being bonded to each other, the surfaces of the metal wiring or the surfaces of the metal coating film can be exposed to both surfaces of the flexible printed wiring board in the manner described above. The exposed portion can be used for the connection with external circuits.

When the two elemental pieces 20 and 30 each having the metal wiring 22, 32 formed on one of the surfaces thereof are bonded as described above, the flexible printed wiring board 3 having the connection regions 23b and 33b on both surfaces thereof can be formed. Therefore, a double-face flexible printed wiring board can be formed at a low cost of production.

Because the flexible printed wiring board 3 having a complicated shape can be formed by freely combining elemental pieces 20, 30 having a simple shape, the waste of the master sheet can be eliminated, and the cost of production can be further reduced.

The embodiment given above represents the case where a double-face flexible printed wiring board 3 is produced using the adhesive resin film 16, but the present invention is not particularly limited thereto.

Referring to FIG. 2(a), reference numeral 40 shows an elemental piece. This elemental piece 40 includes a base film 41 made of a non-thermoplastic resin such as polyimide and a metal wiring 42 formed on the base film 41.

A low melting point metal coating film 43a is formed by solder plating or the like on the surface of an internal bonding region 42a of this elemental piece 40. A coating film 18 made of a thermoplastic resin is formed on the low melting point metal coating film 43a in such a manner as to cover this film 43a. The coating film 18 exhibits its adhesiveness upon being heated. Conductive particles are not dispersed in the coating film 18.

The internal connection region 22a of the elemental piece 20 is so arranged as to face the internal connection region 42a of the elemental piece 40. When the internal connection regions 22a and 42a are pressed to each other while being heated, the coating film 18 is pushed aside from the space between the low melting point metal coating films 23a and 43a. Consequently, the low melting point metal coating films 23a and 24a come into contact with each other. When these metal coating films 23a and 43a are molten and then cooled and solidified, a single layer of a low melting point metal layer 9 is formed. The low melting point metal layer 9 and the internal bonding regions 42a and 22a connected by the low melting point metal layer 9 together form a bonding portion 14 (FIG. 2(b)).

In this low melting point metal layer 9, too, the softened coating film 18 is positioned between the bonding portions 14 when two layers of low melting point metal coating films 43a and 23a are molten. In consequence, the low melting point metal layer 9 does not scatter even when it spills from the connection regions 42a and 22a.

The resin layer 19, that is formed when the coating film 18 is solidified, is sandwiched between the base films 21 and 41 of the two elemental pieces 20 and 40. This resin layer 19 bonds the elemental pieces 20 and 40 to each other, giving one flexible printed wiring board 4.

On the other hand, the external connection regions 22b and 42b of the metal wirings 22 and 42, parts of the portions where the bond portion 14 is not formed, protrude from both surfaces of the flexible printed wiring board 4 and make it possible to establish electric connection with external circuits. Though the low melting point metal coating films 23b and 43b are formed on the surface of the external connection regions 22b and 42b, respectively, these low melting point metal coating films 23b and 43b may be omitted. It is further possible to dispose an adhesive resin on the external connection regions 22b and 42b and to further connect other elemental pieces.

The coating film 18 described above is formed on one of the elemental pieces 20 and 40 that are used for bonding, but one flexible printed wiring board may be formed by thermally bonding together the elemental pieces 40 having the film of the thermoplastic resin formed thereon. In this case, the thickness of the thermoplastic resin film must be small.

Because the present invention can form one flexible printed wiring board by bonding a plurality of elemental pieces to one another, the present invention can improve the production yield of the specially-shaped flexible printed wiring boards. Furthermore, the present invention can flexibly cope with a variety of shapes of flexible printed wiring boards.

What is claimed is:

1. A flexible printed wiring board comprising:
   at least two flexible elemental pieces each having a resin film, a metal wiring formed on said resin film and a low melting point metal coating film formed in at least a part of regions on said metal wiring; and
   an adhesive resin exhibiting an adhesiveness upon heating;
   wherein said elemental pieces are bonded to one another via said adhesive resin, and metal wirings of said elemental pieces are connected via said low melting point metal formed by said low melting point metal coating film that was molten and solidified;
   portions between said metal wirings connected by said low melting point metal coating film are filled with said adhesive resin; and
   a part of said metal wiring of at least one of said two flexible elemental pieces is not facing the other of the two flexible elemental pieces so as to be exposed without being covered with said adhesive resin.

2. The flexible printed wiring board according to claim 1, wherein said low melting point metal coating film is formed on surfaces of said metal wirings that are exposed.

3. A flexible printed wiring board comprising:
   at least two flexible elemental pieces each having a resin film, a metal wiring formed on said resin film and a low melting point metal coating film formed in at least a part of regions on said metal wiring; and
   an adhesive resin exhibiting an adhesiveness upon heating;
   wherein said elemental pieces are bonded to one another via said adhesive resin, and metal wirings of said elemental pieces are connected via said low melting point metal formed by said low melting point metal coating film that was molten and solidified;
   portions between said metal wirings connected by said low melting point metal coating film are filled with said adhesive resin; and
   a part of each of said two flexible elemental pieces is not facing the other flexible elemental piece and a part of said metal wirings is arranged so as to be exposed without being covered with said adhesive resin thereon.

4. The flexible printed wiring board according to claim 3, wherein said low melting point metal coating film is formed on a surface of an exposed metal wiring that is not covered with said adhesive resin of at least one of said two flexible elemental pieces.

* * * * *